United States Patent
Holmstrom et al.

(10) Patent No.: US 11,650,642 B2
(45) Date of Patent: May 16, 2023

(54) ESTIMATING THE TEMPERATURE OF A MEMORY SUB-SYSTEM

(71) Applicant: Micron Technology, Inc., Boise, ID (US)

(72) Inventors: David A. Holmstrom, Los Gatos, CA (US); Jui-Yao Yang, San Jose, CA (US); William Akin, Morgan Hill, CA (US)

(73) Assignee: Micron Technology, Inc., Boise, ID (US)

( * ) Notice: Subject to any disclaimer, the term of this patent is extended or adjusted under 35 U.S.C. 154(b) by 1199 days.

(21) Appl. No.: 16/208,319

(22) Filed: Dec. 3, 2018

(65) Prior Publication Data

US 2020/0174535 A1 Jun. 4, 2020

(51) Int. Cl.
*G06F 1/20* (2006.01)
*G06F 3/06* (2006.01)

(52) U.S. Cl.
CPC ............ *G06F 1/206* (2013.01); *G06F 3/0653* (2013.01); *G06F 3/0683* (2013.01)

(58) Field of Classification Search
CPC ....... G06F 1/206; G06F 3/0653; G06F 3/0683
See application file for complete search history.

(56) References Cited

U.S. PATENT DOCUMENTS

| | | | |
|---|---|---|---|
| 11,169,583 B2 * | 11/2021 | Karalnik | G06F 1/3287 |
| 2007/0211548 A1 * | 9/2007 | Jain | G06F 11/3058 |
| | | | 365/211 |
| 2008/0125915 A1 | 5/2008 | Berenbaum et al. | |
| 2016/0071611 A1 | 3/2016 | Nurminen et al. | |
| 2018/0089048 A1 | 3/2018 | Zou et al. | |
| 2018/0120871 A1 | 5/2018 | Santos et al. | |
| 2018/0173254 A1 | 6/2018 | Li et al. | |
| 2022/0187987 A1 * | 6/2022 | Huang | G06F 3/0614 |

OTHER PUBLICATIONS

PCT Application No. PCT/US2019/063740—International Search Report and Written Opinion dated Mar. 24, 2020, 12 pages.

* cited by examiner

*Primary Examiner* — Mischita L Henson
(74) *Attorney, Agent, or Firm* — Lowenstein Sandler LLP

(57) ABSTRACT

A request for an estimated temperature of a memory sub-system including multiple components can be received. A set of component temperature values based on temperature measurements at the components can be identified. A subset of the component temperature values can be generated by removing one or more of the component temperature values from the set of component temperature values based on one or more criteria. The estimated temperature value that estimates the temperature of the memory sub-system can be generated using the subset of the component temperature values.

20 Claims, 5 Drawing Sheets

US 11,650,642 B2

ESTIMATING THE TEMPERATURE OF A MEMORY SUB-SYSTEM

TECHNICAL FIELD

Embodiments of the disclosure relate generally to memory sub-systems, and more specifically, relate to generating an estimated temperature value that estimates the temperature of a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
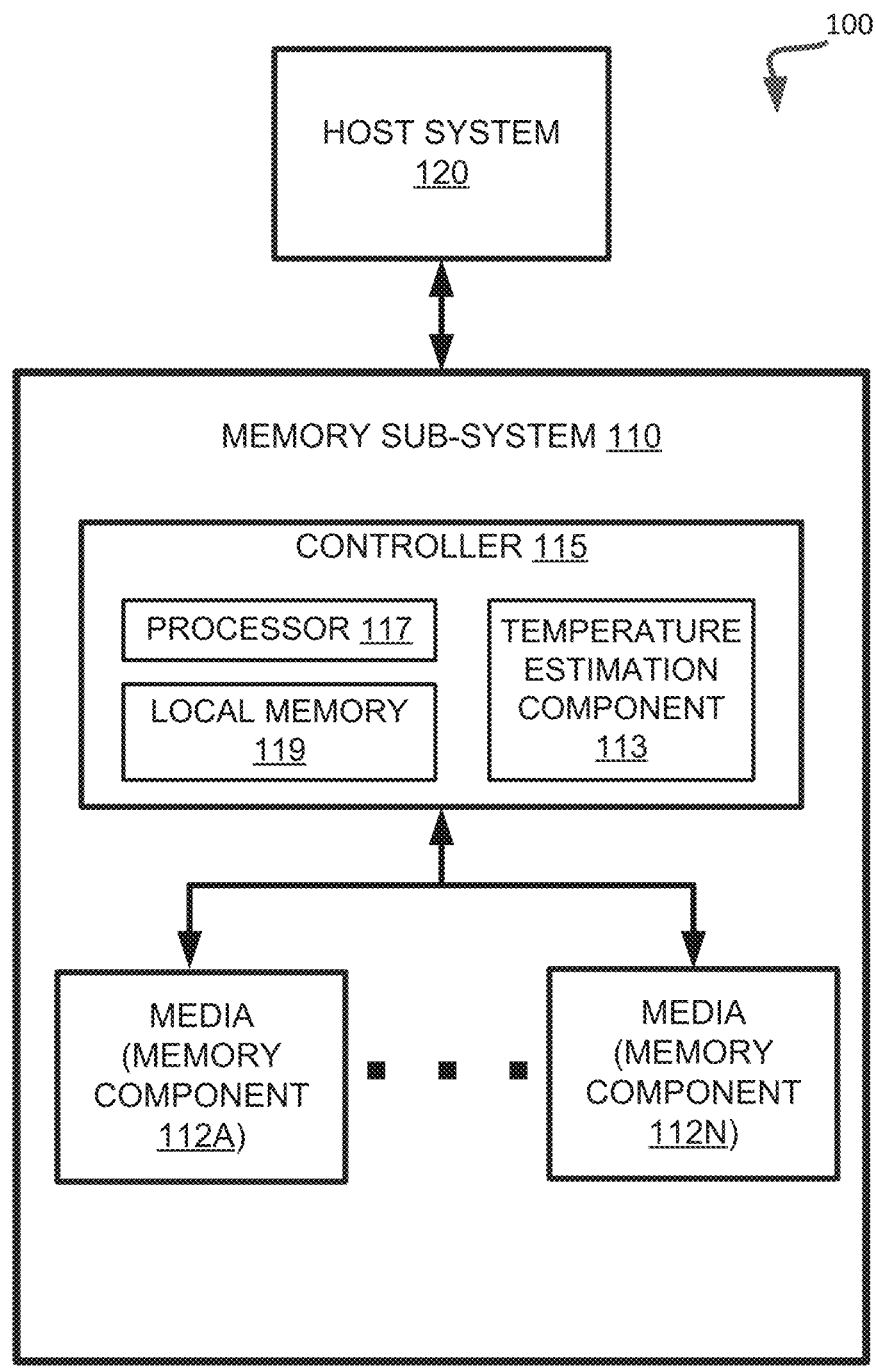
FIG. 1 illustrates an example computing environment that includes a memory sub-system 110 in accordance with some embodiments of the disclosure.

Aspects of the present disclosure are directed to generating an estimated temperature value that estimates the temperature of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

In conventional memory sub-systems, a discrete temperature sensor (e.g., thermistor) is built into the memory sub-system to measure the temperature of the memory sub-system. The memory sub-system can have a significant temperature gradient or variation across the memory sub-system. For example, the temperature difference between two locations within the memory sub-system can differ by 30 degrees Celsius or greater. As such, taking the temperature at a particular location using a discrete temperature sensor does not accurately capture the temperature of the memory sub-system. Inaccurate temperature reporting can increase the time the memory sub-system is operated at critical temperatures. Operating at critical temperatures, such as at or above 70 degrees Celsius can shorten the life of the memory sub-system, lead to performance degradations, and failure, among other issues.

Aspects of the disclosure address the above challenges by generating an accurate estimate of the temperature of the memory sub-system using a subset of component temperature values of components of the memory sub-system.

In some embodiments, raw component temperature values that are indicative of the temperature at individual components of the memory sub-system are obtained from the components of the memory sub-system. Each of the components can include one or more temperature sensors that measure the temperature of the respective component. The components can include one or more memory components as well as other components of the memory sub-system. The raw component temperature values can be obtained asynchronously and opportunistically, such as during a read or write operation on a memory component, to help minimize negative effects on the operation or performance of the component. Predetermined offsets can be applied to the raw component temperature values to generate component temperature values. Each of the offsets can be specific to a particular component of the memory sub-system, and can be based on the particular location of the particular component within the memory sub-system. By applying the offsets to the raw component temperature values, the resultant component temperature values can approximate the temperature of the memory sub-system.

In embodiments, from time to time the memory sub-system can receive a request for the temperature of the memory sub-system from, for example, the host system. Responsive to the request, the memory sub-system can identify in volatile memory the component temperature values that were previously and opportunistically obtained. The memory sub-system generates a subset of component temperature values by removing one or more values from the component temperature values. To determine which values of the component temperature values to remove, the memory sub-system can determine the mean value of the component temperature values and a positive threshold and a negative threshold from the mean value. Component temperature values within the positive threshold and the negative threshold from the mean value can be included in the subset of component temperature values, and component temperature values that are outside the positive threshold and the negative threshold from the mean value are not included in the subset of component temperature values. In embodiments, an estimated temperature value that estimates the temperature of the memory sub-system is generated based on the subset of component temperature values. For example, the mean value or the median value of the subset of component temperature values can be used as the estimated temperature. The memory sub-system can provide the estimated temperature that is based on the subset of component temperature values to the host system in response to the request for the estimated temperature of the memory sub-system. It can be notes the temperature of the memory sub-system can be referred to as the "temperature" or "estimated temperature" of the memory sub-system herein.

Estimating the temperature of a system using the raw temperature values obtained from multiple components that are located in different areas within the memory sub-system and converting the raw temperature values to component temperature values using offsets provides a more accurate and precise temperature estimate of the memory sub-system. Additionally, removing some of the component temperature values to generate the subset of component temperature values, where the subset of component temperature values are used to generate an estimate of the temperature, also helps the accuracy and precision of the estimated temperature. For instance, removing some component temperature values as described herein, removes component temperature values that can be inaccurate and potentially skew the estimated temperature. Additionally, aspects of the present disclose can allow for more accurate and precise estimates of sub-system temperature with or without using a discrete temperature sensor. Moreover, accurate and precise temperature estimates of the sub-system can be used to reduce the time a memory sub-system operates at critical temperatures, which increases the operating life of the memory sub-system and improves performance of the memory sub-system.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a temperature estimation component 113 that performs operations as described herein. In some embodiments, the temperature estimation component 113 can be part of host system 120, controller 115, memory component 112N, an operating system, or an application. Temperature estimation component 113 can generate an estimated temperature for the memory sub-system 110. For example, the controller 115 can include a processor 117 (processing device) configured to execute instructions stored in local memory 119 for performing the operations described herein.

Figure 2A:
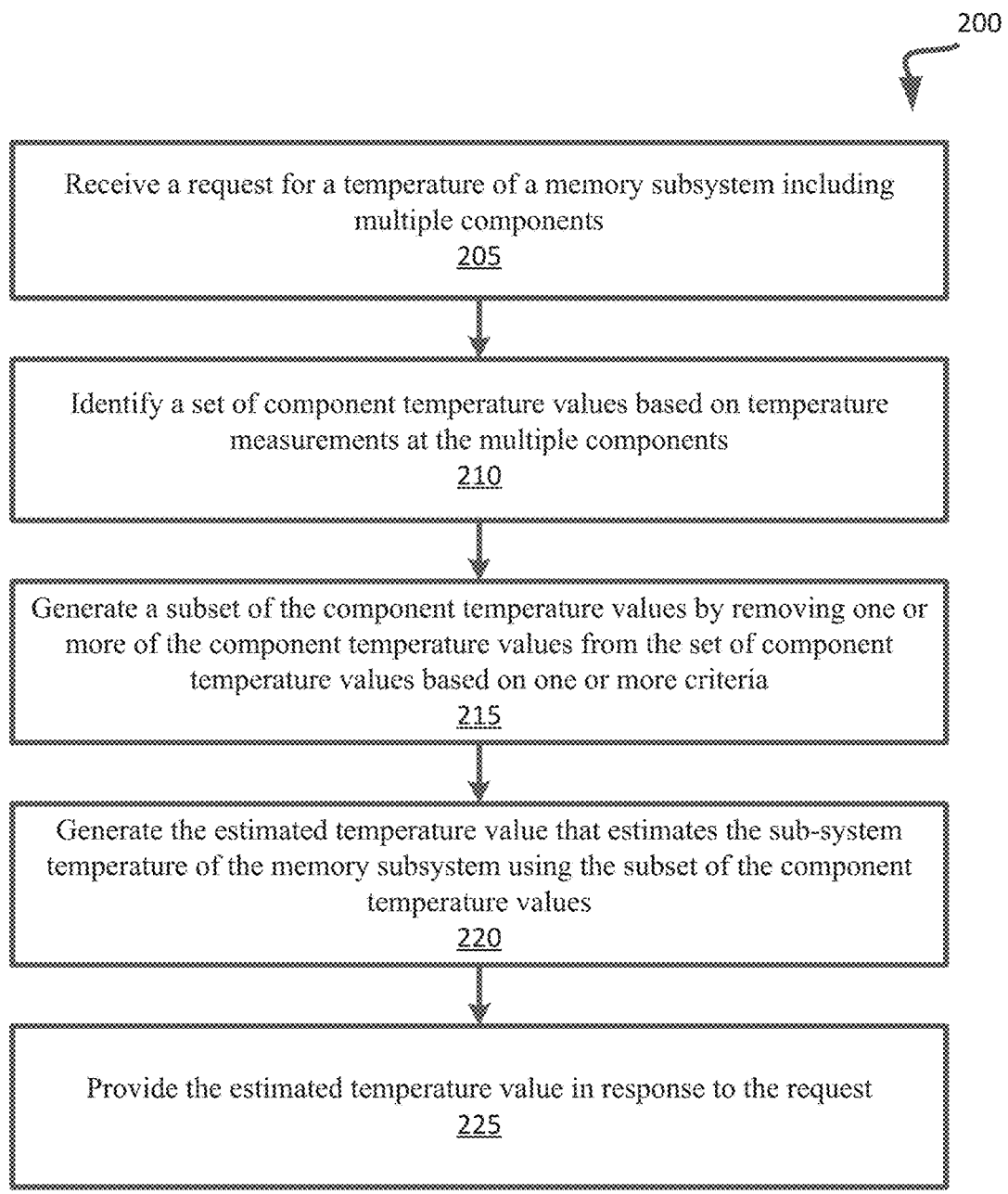
FIG. 2A is a flow diagram of an example method to generate an estimated temperature value that estimates the temperature of a memory sub-system, in accordance with some embodiments of the disclosure.

FIG. 2A is a flow diagram of an example method 200 to generate an estimated temperature value that estimates the temperature of a memory sub-system, in accordance with some embodiments of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 200 is performed by the temperature estimation component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. In some embodiments, the same, different, fewer, or more operations can be used. In embodiments, temperature estimation component 113 can perform one or more of the operations described herein.

At operation 205, processing logic receives a request for a temperature of a memory sub-system 110 that includes multiple components. The memory sub-system 110 can include multiple discrete components that are each encased in a packaging material. The packaging material can have pins or terminals that couple on-chip elements to off-chip elements. The multiple discrete components can be coupled together using interconnects and vias of a printed circuit board. In some embodiments, the request for an estimated temperature is sent from host system 120 and received by controller 115 of memory sub-system 110. In some embodiments, the number of components of a memory sub-system 310 are four or greater.

At operation 210, processing logic identifies a set of component temperature values (also referred to as "component temperature values" herein) based on temperature measurements at the components.

In some embodiments, to identify the set of component temperature values based on the temperature measurements at the components of memory sub-system 110, processing logic receives raw component temperature values from the components of the memory sub-system 110. As further described below with respect to FIG. 3, processing logic can perform a polling operation or an opportunistic operation that requests raw component temperature values from the various components of memory sub-system 110. Responsive to the request for raw component temperature values from the components, processing logic receives the raw component temperature values and stores the raw component temperature values in memory, such as volatile memory.

In some embodiments, to identify the set of component temperature values based on the temperature measurements at the components of memory sub-system 110, processing logic applies a respective offset of multiple offsets to one or more of the raw component temperature values to generate the set of component temperature values. In embodiments, the component temperature values can approximate the estimated temperature of the memory sub-system 110.

In some embodiments and as noted below, an opportunistic operation can refer to an operation to obtain a raw temperature value from a component where the request or retrieval of that information does not interfere with the operation or performance of the component. In some embodiments, processing logic can request one or more of the raw component temperature values as part of a read operation or write operation performed on at least some of the components, such as memory components 112.

In some embodiments, one or more of the offsets is specific to a respective one of the multiple components. For example, a data structure (e.g., a table or record) of offsets can be stored in memory, where the data structure stores offsets for one or more of the components of the memory sub-system 110. A particular offset that is associated with a particular component of the memory sub-system 110 can be applied to the raw component temperature value for the particular component to generate the component temperature value associated with the particular component.

In some embodiments, a first offset for the respective one of the multiple components is applied to a corresponding raw temperature value in a first range of raw component temperature values for the respective component. A second offset for the respective component is applied to the corresponding raw temperature value in a second range of raw component values for the respective component. In some embodiments, the offsets applied to the raw component temperature values are specific to locations of respective components within the memory sub-system 110. Identifying the set of component temperature values based on temperature measurements at the components of the memory sub-system 110 is further described below with respect to FIG. 3.

At operation 215, processing logic generates a subset of the component temperature values by removing one or more of the component temperature values from the set of component temperature values based on criteria. In embodiments, the subset has fewer component temperature values than the set of component temperature values.

In some embodiments, to generate the subset of the component temperature values by removing one or more of the component temperature values from the set of component temperature values based on the criteria, processing logic determines a value range (also referred to as "temperature value range" herein). The value range is an example of criteria. Processing logic identifies one or more component temperature values from the set of component temperature values that are outside the value range. Processing logic removes the identified one or more component temperature values from the set of component temperature values to generate the subset of component temperature values.

In some embodiments, to determine the value range, processing logic can determine a mean value for the set of component temperature values. Processing logic can identify a positive threshold greater than the mean value and a negative threshold less than the mean value. The value range includes component temperature values that are between the positive threshold from the mean value and the negative threshold from the mean value. In some embodiments, the positive threshold and negative threshold can be provided using a table or record stored in memory. In other implementations, the positive threshold and negative threshold hold can be calculated as an X-value standard deviation from the mean value.

In some embodiments, processing logic can determine whether or not to generate the subset of component temperature values. Processing logic can determine whether the set of component temperature values satisfies a threshold temperature. Responsive to determining that the set of component temperature values does not satisfy the threshold temperature, processing logic skips operation 215 and 220 and generates the estimated temperature value that estimates the temperature of the memory sub-system using the set of the component temperature values. Responsive to determining that the set of component temperature values satisfies the threshold temperature, processing logic generates the subset of the component temperature values that are used to further generate the estimated temperature value.

At operation 220, processing logic generates the estimated temperature value that estimates the temperature of the memory sub-system 110 using the subset of the component temperature values. In some embodiments, processing logic determines a mean value of the subset of the component temperature values, and uses the mean value as the estimated temperature value. In embodiments, processing logic determines the median value of the subset of the component temperature values, and uses the median value as the estimated temperature value.

At operation, 225, processing logic provides the estimated temperature value in response to the request. In implementations where the request is received from the host system 120, processing logic provides the estimated temperature value to a host system 120 to allow the host system 120 to perform a corrective action based the estimated temperature value.

In some implementations, processing logic receives, from the host system 120, a corrective action request that is based on the estimated temperature value. Responsive to the corrective action request, processing logic performs a corrective action on at least one of the components of the memory sub-system 110. The corrective action on the at least one of the components of the memory sub-system reduces a temperature of the at least one of the components. Examples of corrective action are further described below at least with respect to FIG. 3.

In some embodiments, the memory sub-system 110 can estimate the temperature of the memory sub-system 110 without a request from the host system 120. For example, the controller of the memory sub-system 110 can periodically determine the estimated temperature of the memory sub-system 110. In some embodiments, the corrective action request is not sent by the host subsystem. For example, the controller of the memory sub-system 110 can estimate the temperature and perform a corrective action if the estimated temperature of the memory sub-system 110 is above a threshold temperature.

Figure 2B:
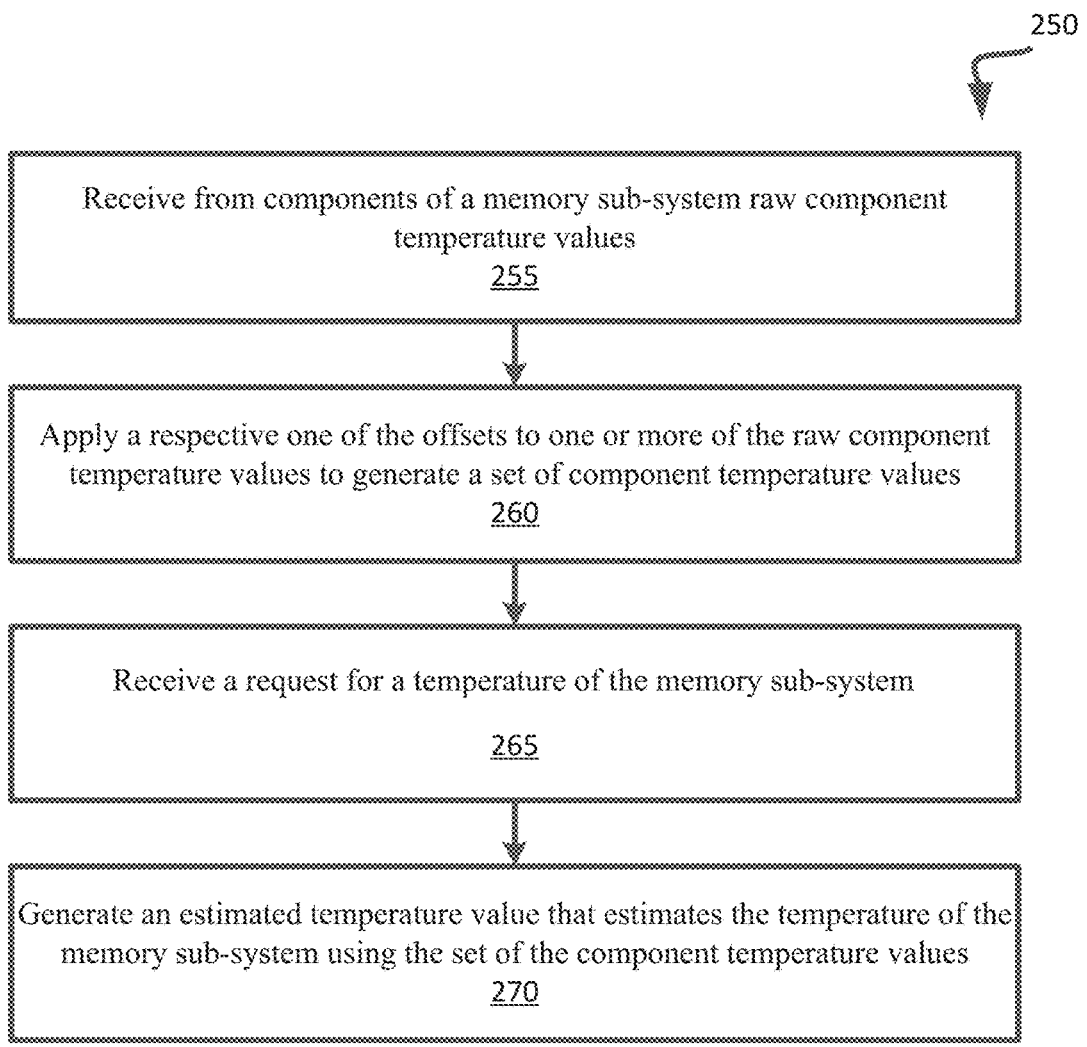
FIG. 2B is a flow diagram of an example method to generate an estimated temperature value that estimates the temperature of a memory sub-system, in accordance with some embodiments of the disclosure.

FIG. 2B is a flow diagram of an example method 250 to generate an estimated temperature value that estimates the temperature of memory sub-system, in accordance with some embodiments of the disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 250 is performed by the temperature estimation component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. In some embodiments, the same, different, fewer, or more operations can be used. In embodiments, temperature estimation component 113 can perform one or more of the operations described herein.

At operation 255, processing logic receives from components of a memory sub-system raw component temperature values. The raw component temperature values are indicative of a temperature of respective ones of the components of memory sub-system 110. .

In some embodiments, processing logic receives from the components of the memory sub-system 110 raw component temperature values. As further described below with respect to FIG. 3, processing logic can perform a polling operation or an opportunistic operation that requests raw component temperature values from the various components of memory sub-system 110. Responsive to the request for raw component temperature values from the components, processing logic receives the raw component temperature values and stores the raw component temperature values in memory, such as volatile memory.

In some embodiments and as herein, an opportunistic operation can refer to an operation to obtain a raw temperature value from a component where the request or retrieval of that information does not interfere with the operation or performance of the component. In some embodiments, processing logic can request one or more of the raw component temperature values as part of a read operation or write operation performed on at least some of the components, such as memory components 112.

At operation 260, processing logic applies a respective one of multiple offsets to one or more of the raw component temperature values to generate a set of component temperature values. The set of component temperature values approximates a temperature of the memory sub-system In embodiments, a component temperature value can approximate the estimated temperature of the memory sub-system 110 and be based on the component's raw component temperature value. The set of component temperature values can be stored in volatile memory, and maintained as the raw component temperature values are updated. In some embodiments, the offsets applied to the raw component temperature values are specific to locations of respective ones of the components within the memory sub-system 110.

At operation 265, processing logic receives a request for a temperature of memory sub-system 110. In some embodiments, the request for a temperature is sent from host system 120 and received by controller 115 of memory sub-system 110. At operation 270, processing logic generates an estimated temperature value that estimates the temperature of the memory sub-system 110 using the set of the component temperature values. In one embodiment, processing logic identifies a mean value of the set of component temperature values. The mean value is used as the estimated temperature value. In another embodiment, processing logic identifies a median value of the set of component temperature values. The median value is used as the estimated temperature value.

In some embodiments, responsive to receiving the request, processing logic determines whether the set of component temperature values satisfies a threshold temperature. Responsive to determining that the set of component temperature values does not satisfy the threshold temperature, processing logic generates the estimated temperature value using the set of the component temperature values. For example, processing logic can determine the mean value or median value of the set of component temperature values. If the mean value or median value is less than the threshold temperature, the controller can use the mean value or median value as of the set of component temperature values as the estimated temperature of the memory sub-system 110. In embodiments, responsive to determining that the set of component temperature values does satisfy the threshold temperature, processing logic generates the subset of component temperature values as described herein and above with respect to FIG. 2A.

In embodiments, processing logic provides the estimated temperature value in response to the request. In implementations where the request is received from the host system 120, processing logic provides the estimated temperature value to the host system 120 to allow the host system 120 to perform a corrective action based the estimated temperature value.

Figure 3:
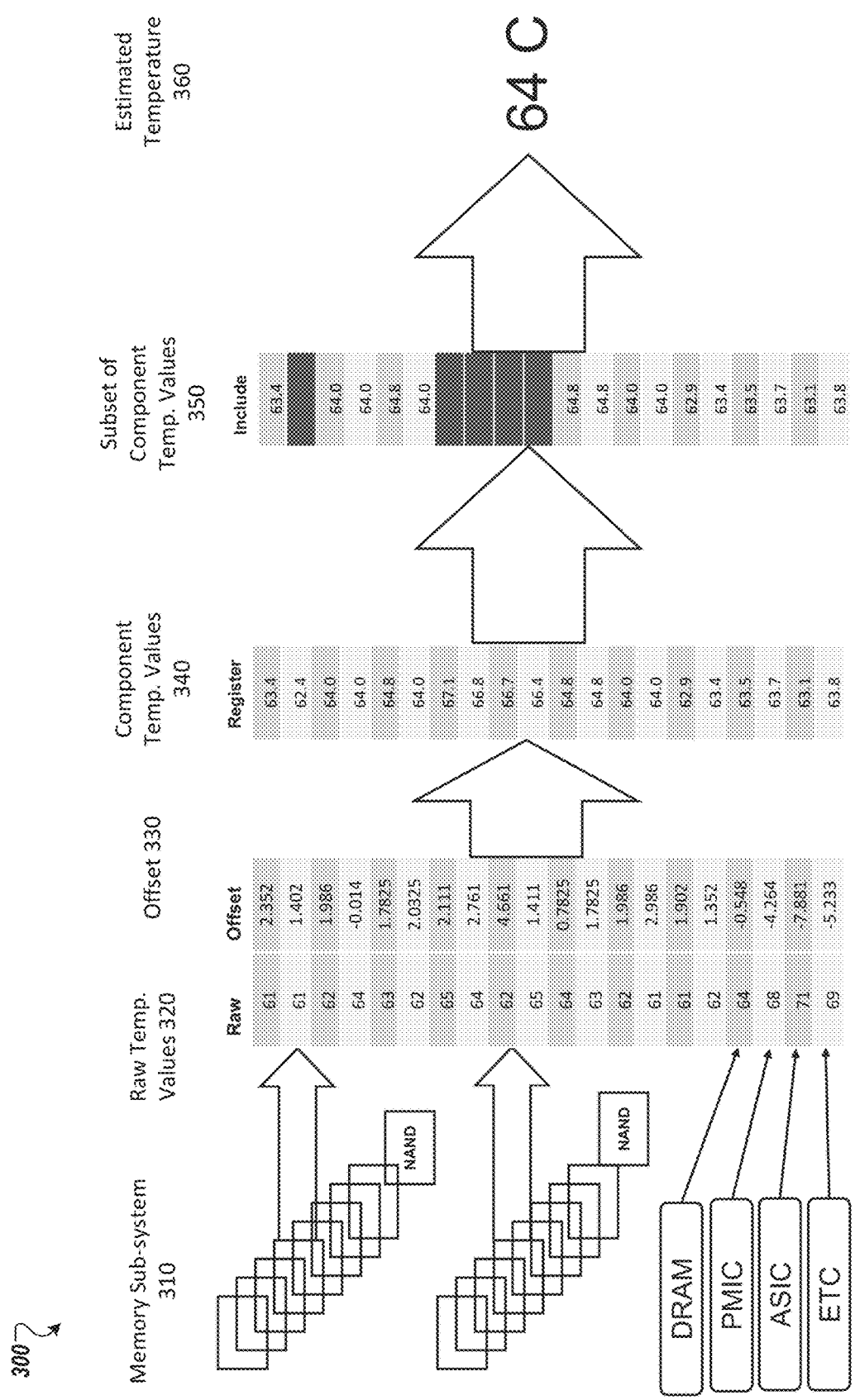
FIG. 3 illustrates a temperature estimation operation, in accordance with embodiments of the disclosure.

FIG. 3 illustrates a temperature estimation operation, in accordance with embodiments of the disclosure. Operation 300 can be used to generate an estimated temperature of a system, such as a memory sub-system 310. It can be noted that estimating a temperature for a memory sub-system is used for purposes of illustration, rather than limitation. In other embodiments, operation 300 can be used to generate an estimated temperature of any system or device, such as a system that includes multiple components disposed at different location in the system. It can be noted that operation 300 can include one or more operations as described herein.

Although described in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, the same, different, fewer, or more operations can be used. In embodiments, temperature estimation component 113 can perform one or more of the operations described herein.

In embodiments, memory sub-system 310 can include multiple components. In some embodiments, memory sub-system can include four or more components. In some embodiments, one or more of the components of memory sub-system 310 are discrete components that are encased in a packaging element (e.g., chip packaging) having one or more pins or terminals external to the packaging that connect on-chip or on-die elements to off-chip or off-die elements (e.g., connects to another discrete component). In embodiments, two or more of the components of memory sub-system 310 are located at different locations within the memory sub-system 310. In some embodiments, memory sub-system may be the same as memory sub-system 110 as described with respect to FIG. 1. As illustrated, memory sub-system 310 includes components including one or more of non-volatile memory components (e.g., NAND), volatile memory components (e.g., DRAM), a power management integrated circuit (PMIC), an application specific integrated circuit (ASIC), or other components, such as a temperature sensor. It can be noted that the components illustrated as part of memory sub-system 310 are provided for illustration rather than limitation. In other embodiments, the memory sub-system 310 can include the same, different, fewer, or more components.

In embodiments, one or more of the various components of memory sub-system 310 measure its own temperature value and can report the temperature value, such as raw temperature values 320 (also referred to as "raw component temperature values 320" herein), to the controller of memory sub-system 310. The raw temperature values 320 can be temperature values that are indicative of the temperature of the respective component of memory sub-system 310. In embodiments, each component of the memory sub-system can report respective raw temperature values 320. A component of the memory sub-system 310 can measure one or more measured raw temperature values. For instance, a temperature sensor can measure a single raw temperature value that is indicative of the temperature of the temperature sensor. In another instance, a memory component can have multiple die where a raw temperature value for each die can be reported. For purposes of illustration, rather than limitation, the temperature values described herein unless otherwise described are in degrees Celsius (C). In can be noted that other temperature scales, such as Fahrenheit, can be used in other embodiments.

In embodiments, the raw temperature values 320 can be obtained using a polling operation that periodically polls or requests one or more components of the memory sub-system 310 for raw temperature data (e.g., raw temperature value 320) indicative of the temperature of the respective component. In some embodiments, a controller of the memory sub-system 310 can poll or provide a request to the various components of the memory sub-system 310. In embodiments, the polling of the components of the memory sub-system 310 can be performed serially, in parallel, or a combination thereof. In some embodiments, components of the memory sub-system 310 can be polled according to a schedule specific to the particular component.

In other embodiments, the raw temperature values 320 can be obtained using an opportunistic operation. An opportunistic operation can refer to an operation to obtain a raw temperature value from a component where the request or retrieval of that information does not interfere with the operation or performance of the component. In an embodiment, a request for raw temperature value(s) from a memory component can be part of a read operation of the memory component. For example, a read request sent by the controller to a memory component can include a temperature request for the raw temperature value(s) of the memory component. In response to the read request, the memory component can return a data stream that includes read data and raw temperature data. In an embodiment, a request for raw temperature value(s) from a memory component can be part of a write operation to write data at the memory component. For example, a write request sent by the controller to a memory component can include a temperature request for the raw temperature value(s) of the memory component. In response to the write request, the memory component can write data to memory and return a write acknowledgement to the controller that includes the raw temperature value(s). Read operations and write operations are examples of an opportunistic operation and are provided for purposes of illustration, rather than limitation. In other embodiments, the opportunistic operation can include other operations of memory sub-system 310.

In embodiments, the received raw temperature values 320 can be stored at volatile memory, such as DRAM. In embodiments, the raw temperature values 320 can be continually updated as new temperature data is received. In some embodiments, the raw temperature values 320 are continually collected, stored, and updated when new raw temperature values are received. In some embodiments, a historical record of raw temperature values 320 can be collected and stored in memory, such as non-volatile memory.

In embodiments, offsets 330 can refer to a value that is applied (e.g., added or subtracted) to a raw temperature value 320 of a component to generate a component temperature value (e.g., component temperature values 340) for the particular component. The component temperature values 340 (also referred to as a "set of component temperature values" herein) can refer to approximations of the sub-system temperature (e.g., temperature of the memory sub-system 310) for a given raw temperature value of a respective component. It can be noted that since the temperature difference between different components in a memory sub-system 310 can be large and the difference between the temperature of components and the temperature of the memory sub-system 310 can also be large, an offset 330 can be applied to raw temperature values 320 to transform (e.g., normalizes) the raw temperature values 320 to approximations of the sub-system temperature of the memory sub-system 310.

In embodiments, the offsets 330 can be predetermined values that are stored in non-volatile memory. During operation of the memory sub-system 310, the offsets 330 can be loaded into volatile memory and used to generate component temperature values 340. In embodiments, responsive to obtaining the raw temperature values 320, corresponding offsets 330 can be applied to the raw temperature values 320 to generate component temperature values 340. The resultant component temperature values 340 can be stored in volatile memory, such as a register.

In some embodiments and as noted above, the raw temperature values 320 can be continuously updated using a polling operation or opportunistic operation. Responsive to receiving the one or more raw temperature values 320, the corresponding offset 330 can be applied and the resultant component temperature values 340 can be stored in volatile memory of the memory sub-system 310. The component temperature values 340 can be continuously updated as new raw temperature values 320 are requested and received by the controller of the memory sub-system 310. The memory sub-system 310 can maintain the component temperature values 340 by updating the component temperature values 340 as new raw temperature values 320 are received.

In some embodiments, the memory sub-system 310 can receive a request for the estimated temperature of the memory sub-system 310. Responsive to receiving an estimated temperature request (e.g., a request for the temperature of the memory sub-system 310), the component temperature values 340 can be retrieved from the volatile memory (e.g., DRAM) and used to generate the estimated temperature value indicative of the temperature of the memory sub-system 310. In some embodiments, by continuously retrieving raw temperature values 320, applying offsets 330, generating and updating component temperature values 340, and storing the component temperature values 340 in memory, rather performing the aforementioned responsive to an estimated temperature request allows the memory sub-system 310 to avoid performance degradation resulting from concurrently polling most or all the components of the memory sub-system 310 for raw temperature values 320 responsive to an estimated temperature request.

In embodiments, one or more of offsets 330 are specific to a respective component of memory sub-system 310. For example, a specific NAND can have an offset of 2.3 degrees Celsius while another NAND can have an offset of 1.4 degrees Celsius.

In embodiments, a particular component of memory sub-system 310 can have more than one offset that is specific to the component. In embodiments, a first offset is applied to a raw temperature value 320 for a respective component if the raw temperature value 320 is within a first temperature range, and a second offset that is different than the first offset is applied to a raw temperature value 320 for the respective component if the raw temperature value 320 is within a second temperature range. For example, an offset of 1.9 degrees Celsius can be applied to raw temperature values in a range of 60-65 degrees Celsius for a particular component, and an offset of 2.3 degrees Celsius can be applied to raw temperature values in a range of 66-70 degrees Celsius for the same component.

In some embodiments, one or more of the offsets 330 are specific to locations of the components within a memory sub-system 310. For example, a particular component's offset can be based on its location within the memory sub-system 310, and be different than the offset of another component at a different location within the memory sub-system 310. In embodiments, each thermal sensing component can deviate from the overall sub-system temperature because a multitude of factors (e.g., location, workloads, surrounding components, and internal heating, cooling inefficiencies, etc.) The location of the thermal sensing component can be chosen for various reasons (e.g., floor space, relation to a thermally sensitive component, etc.). Each physical location can represent a compromise. If the component outputs thermal data that is being used to directly indicate the overall memory sub-system temperature, there can exist some deviation from the actual temperature of the overall memory sub-system 310, for the reasons stated above. If there are multiple thermal sensing components, each the components can have some level of compromise or difference when compared to the overall sub-system temperature. In embodiments, the correlation process (e.g., using particular offsets for components at a particular location) minimizes the effect of the above mentioned compromises by measuring the overall sub-system temperature (e.g., integrating IR temperature measurements across the entire subsystem taken during product design or test) and comparing that to the temperature output of each thermal sensing component to the integrated sub-system temperature to generate an offset for each component at a particular location and for a given condition of the sub-system (e.g., Idle, Write, Read, high velocity, low velocity, etc.). Certain locations on the memory sub-system 310 can have differing thermal load with each different operational and non-operational conditions. Each component of the memory sub-system 310 can have a different offset from components at different locations in the memory sub-system 310. Each component of the memory sub-system 310 can have multiple different offsets based on the operational conditions of the memory sub-system 310.

In some embodiments, one or more of the raw temperature values 320 or component temperature values 340 can be stored in volatile memory and not stored in non-volatile memory. In some embodiments, one or more of the raw temperature values 320 or component temperature values 340 can be stored in a record in non-volatile memory to generate a historical record of the data.

In embodiments, the memory sub-system 310 can receive a request for an estimated temperature of the memory sub-system 310. The estimated temperature is the temperature of the particular memory sub-system rather than the temperature of the particular component of the memory sub-system. Each thermal reporting component of the memory sub-system 310 can be combined with a pre-characterized offset (specific to each component) for location and workload to represent the particular component's "estimate" of the overall sub-system temperature. In embodiments, the estimated temperature of the memory sub-system 310 operates on a collective of these estimates across all (or some) thermal reporting devices and eliminates the outlying estimates based on one or more rules.

In some embodiments, the request for estimated temperature can originate or be sent from the host system. For example, the host system can request a controller of memory sub-system 310 for the estimated temperature of the memory sub-system 310. In other embodiments, the request for the estimated temperature can be from another source, such as the memory sub-system 310 itself, a peripheral device, and so forth.

In embodiments, memory sub-system 310 can perform an estimation operation to estimate the temperature of the memory sub-system 310. In one embodiment, to perform the estimation operation, a subset of component temperature values 350 is generated by removing one or more the component temperature values from the set of component temperature values 340 based on criteria or rules. By removing one or more "outliers" from the component temperature values 340, the estimated temperature can be more accurately estimated.

In embodiments, one or more of the highest component temperature values can be removed from the component temperature values 340 to generate the subset of component temperature values 350. In embodiments, one or more of the lowest component temperature values can be removed from the component temperature values 340 to generate the subset of component temperature values 350. In embodiments, both one or more of the highest component temperature values and one or more of the lowest component temperature values can be removed from the component temperature values 340 to generate the subset of component temperature values 350.

In some embodiments, to generate the subset of component temperature values 350, one or more of component temperature values 340 that are outside a value range (also referred to as "temperature value range" herein) are identified. The identified component temperature values that are outside the value range are removed from the set of component temperature values 340 to generate the component temperature values 340. Said differently, the identified component temperature values that are outside the value range are not included in the subset of component temperature values 350, and the component temperature values that are within the value range are included in the subset of component temperature values 350. For example, one or more value ranges for the component temperature values 340 can be stored in a table or record at memory sub-system 310. A particular value range can be selected from multiple value ranges based on one or more factors. For instance, the particular value range can be selected based on the mean value or median value of the component temperature values 340, where a particular value range is associated with the mean value or median value of the component temperature values 340. Similarly, component temperature values that are outside a selected value range are removed from component temperature values 340 and other component temperature values that are within the selected value range are kept to be part of subset of component temperature values 350. In another example, a value range can be selected based on whether a threshold number of component temperature values 340 are within the particular value range. In still another example, a value range can be selected based on having the greatest number of component temperature values 340 within the value range as compared to the other value ranges in the table or record.

In some embodiments, to generate the subset of component temperature values 350, the mean value (or median value) of the component temperature values 340 can be determined. A positive threshold greater than the mean value (or median value) can be identified. A negative threshold less than the mean value (or median value) can be identified. The value range can include component temperature values that are between the positive threshold and the negative threshold from the mean value or median value. The positive threshold or negative threshold can be identified from a table or record, where the mean value or median value is associated with a particular positive or negative threshold. For example, if the mean value of the component temperature value 340 is 63.4 degrees Celsius, the memory sub-system 310 can find the mean value in the record or table and identify a positive threshold of 66 degrees Celsius and a negative threshold of 61 degrees Celsius. The value range is 61 through 66 degrees Celsius. Component temperature values that are outside the value range of 61 through 66 degrees Celsius are removed and the component temperature values that are within the value range are kept to generate the subset of component temperature values 350.

In some embodiments, to generate the subset of component temperature values 350 the memory sub-system 310 can calculate the standard deviation or standard error. The value range can be set as a predetermined standard deviation (e.g., fraction or integer, such a 0.75 standard deviations from the mean) from the mean. Similarly, values of component temperature values 340 that are outside the value range are removed and values of component temperature values 340 that are within the value range are kept to generate subset of component temperature values 350.

In some embodiments, rather than computing the standard deviation, a table or record can be implemented to identify the value range and generate the subset of component temperature values 350. For example, a mean value of component temperature values 340 can be determined. A table or record can be used to identify the predetermined standard deviation of the mean to determine the value range. In embodiments, the table or record can be stored at non-volatile memory or volatile memory. In embodiments, if a value is determined to be removed from the component temperature values 340 the particular temperature value is not loaded into registers of the subset of component temperature values 350.

In some embodiments and as noted above, the component temperature values 340 can be repeatedly updated based on a polling operation or opportunistic operation. In embodiments, the subset of component temperature values 350 is not generated at each instance that the component temperature values 340 are updated. Rather, responsive to receiving a request for an estimated temperature of the memory sub-system 310, the controller of memory sub-system 310 can generate the subset of component temperature values 350 using the pre-stored component temperature values 340.

In some embodiments, the temperature estimation component 113 generates an estimated temperature value (also referred to as an "estimated temperature value 360" herein) that estimates the temperature using the subset of component temperature values 350. In some embodiments, the temperature estimation component 113 determines the mean value of the subset of component temperature values 350, and uses the mean value as the estimated temperature value 360. In some embodiments, the temperature estimation component 113 determines the median value of the subset of component temperature values 350, and uses the median value as the estimated temperature value 360.

In some embodiments, responsive to a request for an estimated temperature of the memory sub-system 310, the temperature estimation component 113 can determine whether or not to generate the subset of component temperature values 350. In an embodiment, the temperature estimation component 113 can determine whether the component temperature values 340 satisfy a threshold temperature. Responsive to determining that the component temperature values 340 do not satisfy the threshold temperature, temperature estimation component 113 generates the estimated temperature value 360 indicative of the temperature of the memory sub-system using the component temperature values 340. For example, the memory sub-system 310 can be operating well below critical temperatures, and the estimated temperature (e.g., accuracy of) based on the component temperature values 340 is sufficient for the particular application.

In embodiments, responsive to determining that the component temperature values 340 satisfies the threshold temperature, temperature estimation component 113 generates the subset of the component temperature values 350 that are used to further generate the estimated temperature value 360, as described herein.

For example, temperature estimation component 113 can evaluate the component temperature values 340 to determine a mean or median. If the mean value or median value of the component temperature values 340 is less than a threshold temperature (e.g., 58 degrees Celsius), temperature estimation component 113 can use the mean or median of the component temperature values 340 as the estimated temperature value 360. If the mean value or median value of the component temperature values 340 is greater than or equal to the threshold temperature, temperature estimation component 113 proceeds with generating the subset of component temperature values 350 and generating the estimated temperature value 360 using the subset of component temperature values 350, as described herein.

In some embodiments, the request for the estimated temperature of the memory sub-system 310 is sent by a host system. After the estimated temperature value 360 is generated, temperature estimation component 113 can provide the estimated temperature value 360 to the host system. In embodiments, temperature estimation component 113 can receive from the host system a corrective action request that is based on the estimated temperature value 360 that was sent to the host system. Responsive to the receiving the corrective action request, temperature estimation component 113 performs a corrective action on at least one of the components of memory sub-system 310. The corrective action can reduce the temperature of the particular component(s), which reduces the temperature of memory sub-system 310. For example, a corrective action can include, but is not limited to, turning-off a particular component, putting a particular component in a sleep-mode that reduces energy or current consumption, reducing the workload of a particular component, throttling a component (e.g., reducing a clock speed), and so forth.

In some embodiments, the estimated temperature value 360 is provided to the host system and allows the host system to perform a corrective action based on the estimated temperature value 360. For example, a corrective action performed by the host system can include, but is not limited to, turning on a fan or increasing the speed of a fan, such as a fan for a memory sub-system.

Figure 4:
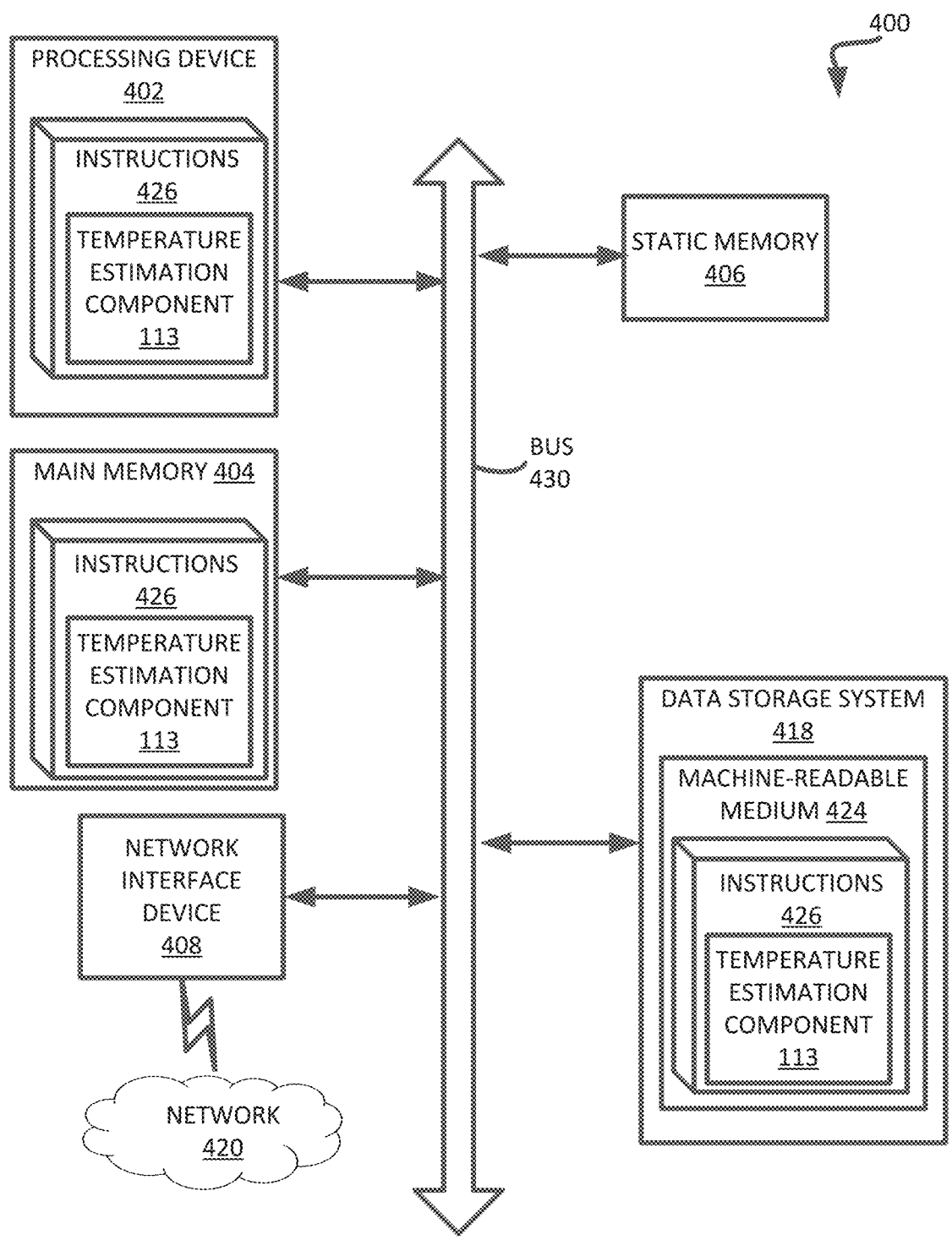
FIG. 4 illustrates an example machine of a computer system within which a set of instructions, for causing the machine to perform any one or more of the methodologies discussed herein, can be executed.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature estimation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a non-transitory computer-readable storage medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to the temperature estimation component 113 of FIG. 1. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, coupled with the memory device, to perform operations comprising:
      receiving a request for a temperature of a memory sub-system comprising a plurality of components;
      identifying a set of component temperature values based on temperature measurements at the plurality of components;
      generating a subset of the component temperature values by removing one or more of the component temperature values from the set of component temperature values based on one or more criteria;
      generating an estimated temperature value that estimates the temperature of the memory sub-system using the subset of the component temperature values; and
      performing a corrective action on at least one of the plurality of components that reduces a temperature of the at least one of the plurality of components, the corrective action to increase an operating life of the memory sub-system.

2. The system of claim 1, wherein the request is received from a host system, the operations further comprising:
   providing the estimated temperature value to the host system; and
   receiving, from the host system, a corrective action request that is based on the estimated temperature value, wherein the corrective action is performed based on the corrective action request.

3. The system of claim 1, wherein the operations further comprise:
   providing the estimated temperature value to a host system to allow the host system to perform the corrective action based the estimated temperature value.

4. The system of claim 1, the operations further comprising:
   determining whether the set of component temperature values satisfies a threshold temperature;
   responsive to determining that the set of component temperature values does not satisfy the threshold temperature, generating the estimated temperature value that estimates the temperature of the memory sub-system using the set of the component temperature values; and
   responsive to determining that the set of component temperature values satisfies the threshold temperature, generating the subset of the component temperature values that are used to further generate the estimated temperature value.

5. The system of claim 1, wherein identifying the set of component temperature values based on the temperature measurements at the plurality of components, comprises:
   receiving from the plurality of components of the memory sub-system a plurality of raw component temperature values; and
   applying a respective one of a plurality of offsets to one or more of the plurality of raw component temperature values to generate the set of component temperature values that approximates the temperature of the memory sub-system.

6. The system of claim 5, wherein the operations further comprising:
   requesting one or more of the plurality of raw component temperature values as part of a read operation or write operation performed on at least one of the plurality of components.

7. The system of claim 5, wherein each of the plurality of offsets is specific to a respective one of the plurality of components.

8. The system of claim 5, wherein a first offset for the respective one of the plurality of components is applied to a corresponding raw component temperature value in a first range of raw component temperature values for the respective component, and wherein a second offset for the respective component is applied to the corresponding raw component temperature value in a second range of raw component values for the respective component.

9. The system of claim 5, wherein the plurality of offsets applied to the plurality of raw component temperature values are specific to locations of respective ones of the plurality of components within the memory sub-system.

10. The system of claim 1, wherein generating the subset of the component temperature values by removing one or more of the component temperature values from the set of component temperature values based on the one or more criteria, comprises:
    determining a value range associated with the set of component temperature values;
    identifying one or more component temperature values from the set of component temperature values that are outside the value range; and
    removing the identified one or more component temperature value from the set of component temperature values to generate the subset of component temperature values.

11. The system of claim 10, wherein determining the value range associated with the set of component temperature values, comprises:
    determining a mean value for the set of component temperature values; and
    identifying a positive threshold greater than the mean value and a negative threshold less than the mean value, wherein the value range comprises values that are between the positive threshold and the negative threshold.

12. The system of claim 1, wherein generating the estimated temperature value that estimates the temperature of the memory sub-system using the subset of the component temperature values, comprises:
  determining a mean or median of the subset of the component temperature values to use as the estimated temperature value.

13. A system comprising:
  a memory device; and
  a processing device, coupled with the memory device, to perform operations comprising:
    receiving, from a plurality of components of a memory sub-system, a plurality of raw component temperature values indicative of a temperature of respective ones of the plurality of components;
    applying a respective one of a plurality of offsets to one or more of the plurality of raw component temperature values to generate a set of component temperature values that approximates a temperature of the memory sub-system;
    receiving a request for a temperature of the memory sub-system;
    responsive to the request, generating an estimated temperature value that estimates the temperature of the memory sub-system using the set of the component temperature values; and
    performing a corrective action on at least one of the plurality of components that reduces a temperature of the at least one of the plurality of components, the corrective action to increase an operating life of the memory sub- system.

14. The system of claim 13, the operations further comprising:
  determining whether the set of component temperature values satisfies a threshold temperature, wherein responsive to determining that the set of component temperature values does not satisfy the threshold temperature, the estimated temperature value is generated using the set of the component temperature values.

15. The system of claim 13, wherein to generating the estimated temperature value that estimates the temperature of the memory sub-system, comprises:
  identifying a mean value of the set of component temperature values, wherein the mean value is used as the estimated temperature value.

16. The system of claim 13, wherein generating the estimated temperature value that estimates the temperature of the memory sub-system, comprises:
  identifying a median value of the set of component temperature values, wherein the median value is used as the estimated temperature value.

17. The system of claim 13, wherein the plurality of offsets applied to the plurality of raw component temperature values are specific to locations of respective ones of the plurality of components within the memory sub-system.

18. A method comprising:
  receiving a request for a temperature of a memory sub-system comprising a plurality of components;
  identifying a set of component temperature values based on temperature measurements at the plurality of components;
  generating a subset of the component temperature values by removing one or more of the component temperature values from the set of component temperature values based on one or more criteria;
  generating, by a processing device, an estimated temperature value that estimates the temperature of the memory sub-system using the subset of the component temperature values;
  performing a corrective action on at least one of the plurality of components that reduces a temperature of the at least one of the plurality of components, the corrective action to increase an operating life of the memory sub-system.

19. The method of claim 18, wherein to generating the subset of the component temperature values by removing one or more of the component temperature values from the set of component temperature values based on the one or more criteria, the method further comprises:
  determining a value range associated with the set of component temperature values;
  identifying one or more component temperature values from the set of component temperature values that are outside the value range; and
  removing the identified one or more component temperature value from the set of component temperature values to generate the subset of component temperature values.

20. The method of claim 18, wherein identifying the set of component temperature values based on the temperature measurements at the plurality of components, the method further comprises:
  receiving from the plurality of components of the memory sub-system a plurality of raw component temperature values; and
  applying a respective one of a plurality of offsets to one or more of the plurality of raw component temperature values to generate the set of component temperature values that approximates the temperature of the memory sub-system.

* * * * *